(12) United States Patent
Godo et al.

(10) Patent No.: US 6,225,810 B1
(45) Date of Patent: May 1, 2001

(54) LOOP RESISTANCE TESTER (LRT) FOR CABLE SHIELD INTEGRITY

(75) Inventors: Erik L. Godo, Redmond; Bruce Van Deventer, Lynnwood; Mervin E. Eaton, Shoreline; John F. Gonder, Mountlake Terrace, all of WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/022,576

(22) Filed: Feb. 12, 1998

(51) Int. Cl.[7] .................... G01R 31/08; G01R 31/28; H01H 31/02
(52) U.S. Cl. .................... 324/525; 324/529; 324/537
(58) Field of Search .................... 324/537, 529, 324/525

(56) References Cited

U.S. PATENT DOCUMENTS

| | | |
|---|---|---|
| 3,711,767 * | 1/1973 | Campell, Jr. et al. .......... 324/51 |
| 3,771,049 | 11/1973 | Piccione . |
| 3,990,003 | 11/1976 | Agee, Jr. et al. . |
| 4,335,348 * | 6/1982 | Reed et al. .......... 324/51 |
| 4,425,542 | 1/1984 | Tsaliovich et al. . |
| 4,973,911 | 11/1990 | Marshall . |
| 5,057,772 | 10/1991 | Bruno et al. . |
| 5,189,375 * | 2/1993 | Tuttle .......... 324/537 |
| 5,378,992 | 1/1995 | Murphy . |
| 5,391,991 * | 2/1995 | Tuttle .......... 324/529 |
| 5,463,317 | 10/1995 | Murphy . |
| 5,612,624 | 3/1997 | Clinton . |

* cited by examiner

*Primary Examiner*—Safet Metjahic
*Assistant Examiner*—James Kerveros
(74) *Attorney, Agent, or Firm*—Conrad O. Gardner

(57) ABSTRACT

A loop resistance tester (LRT) for shield integrity testing comprising three elements: a "drive" current coupler, a "sense" current coupler, joint probes, and an instrument assembly. A low-power excitation current is sent from the instrument into the drive coupler, which is essentially a transformer. This induces a current in the electrical cable under test, as long as that cable and the connected structure form a continuous current path, or loop. This induced loop current is detected by the "sense" current coupler (transformer) and is measured by the instrument. The ratio of the loop voltage to loop current, as phasor values, gives the complex loop impedance, the real part of which is the loop resistance.

23 Claims, 5 Drawing Sheets

$V = K \cdot I$

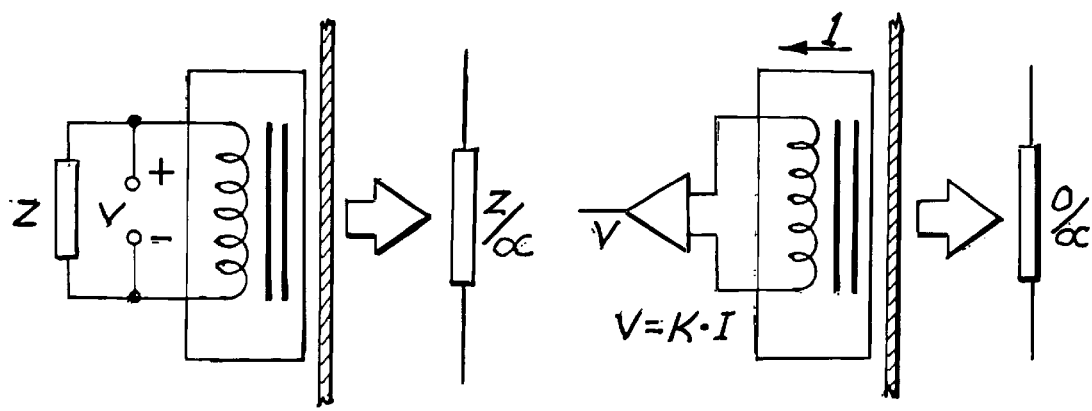
Fig. 6.
(Prior Art)
Fig. 7.
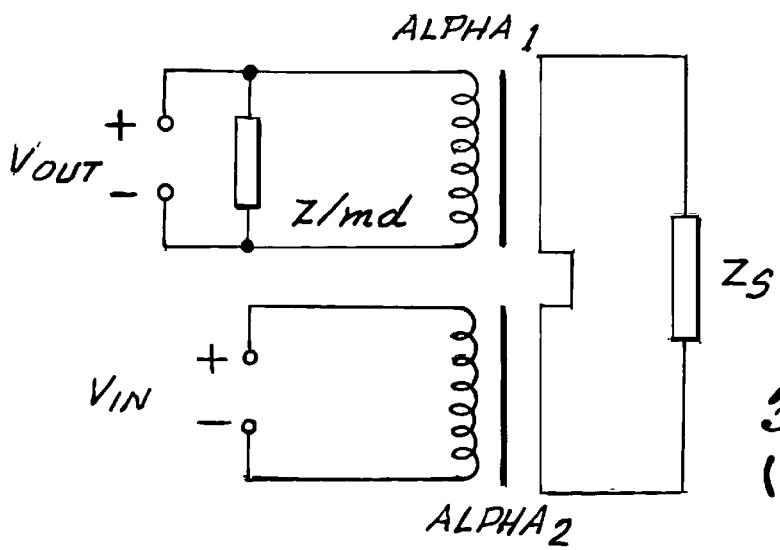
Fig. 8.
(Prior Art)
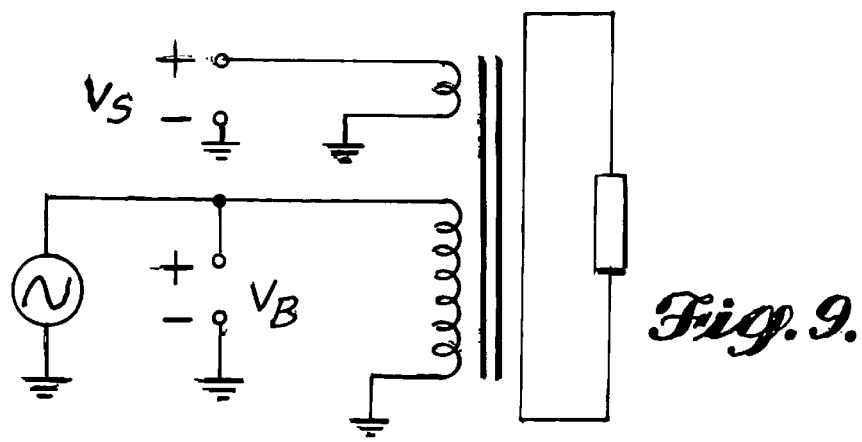
Fig. 9.

LOOP RESISTANCE TESTER (LRT) FOR CABLE SHIELD INTEGRITY

INTRODUCTION

The present invention is an improvement over U.S. Pat. No. 5,378,992 issued Jan. 3, 1995, assigned to The Boeing Company, titled "Shield Integrity Monitor". The '992 patent describes a method and apparatus for non-invasively measuring the resistance of electrical cable shielding which connects to a common ground, e.g., aircraft structure. The electrical cable and the aircraft structure to which it attaches from a continuous loop through which current can flow. A known low-level AC electrical voltage is induced around this loop via a clamp-on toroidal electrical coupler, and the resulting loop current is measured by another clamp-on toroidal coupler. The complex ratio of the current induced in the loop to the loop voltage gives the loop impedance, the real, resistive, part of which is an indication of the integrity of the electrical shielding and it's bonding to aircraft structure. In addition, a joint measurement mode is provided in which a pair of probes make electrical contact onto two parts of the loop being tested. The ratio of the measured voltage difference across these probes to the current induced in the loop provides the resistance between the two probes. These probes are used to identify where in the loop the problem lies.

Problem Solved by This Invention

The present invention is an improvement over U.S. Pat. No. 5,378,992 and removes the need for calibration of the instrument, and simplifies the computations needed to generate a measurement. The hereinafter described system allows for easier use by the mechanic in the shop or in the field.

BACKGROUND INFORMATION

A previous non-invasive shield continuity tester shown in U.S. Pat. No. 5,378,992 utilized laboratory test equipment in a prototype embodiment, e.g., a network analyzer and a P.C. Such equipment can also be utilized to determine the existence of corrosion. This embodiment was cumbersome in that it required three operators viz. one at the system with a headset, one at the aircraft with a headset, and one hooking and unhooking the system to the aircraft. Consequently, a development program commenced to overcome these deficiencies and develop further features which would permit a single operator to test an entire aircraft cable system in the field.

BRIEF SUMMARY OF THE INVENTION

A loop resistance tester (LRT) for shield integrity testing. The tester utilizes a drive current probe having two windings, the extra winding placed on the drive current probe being utilized to measure the voltage actually forced on the shield of the shielded wiring.

BRIEF DESCRIPTION OF THE SEVERAL VIEWS OF THE DRAWING

FIG. 6 is a schematic illustrative of the transfer impedance of the sense probe in accordance with the previous method shown in U.S. Pat. No. 5,378,992;

FIG. 7 is a schematic of the present method where a low impedance is reflected to zero;

FIG. 8 is a schematic helpful in understanding the old method of loop impedance calculation in accordance with the shield integrity monitor shown in U.S. Pat. No. 5,378,992;

FIG. 9 is a schematic deemed helpful in an understanding of coupler operation helpful to the operator;

Theory of Operation of the Present Shield Integrity Monitoring System for Shielded Wire The features of the present system remove the need for calibration of the instrument, and simplify the computations needed to generate a measurement.

1) Voltage Sensing Winding:

Instead of using a drive current probe with only one winding, use a drive current probe with two windings, one much less turns than the other.

Figure 1:
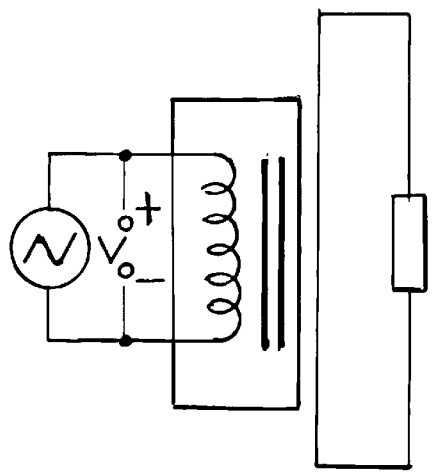
FIG. 1 is a schematic illustrative of a drive current probe having only one winding as used in the method shown in prior art U.S. Pat. No. 5,378,992.

FIG. 1 is illustrative of the method in U.S. Pat. No. 5,378,992, where a single winding is placed on the "drive probe" and is used to measure the induced voltage on the shield of the coaxial wire. The "drive probes" are represented by the components in the boxes. This winding has as small a number of turns as practical such that the voltage is good representation of the voltage actually forced around the loop of wire and structure. Ideally this should be one turn.

Figure 2:
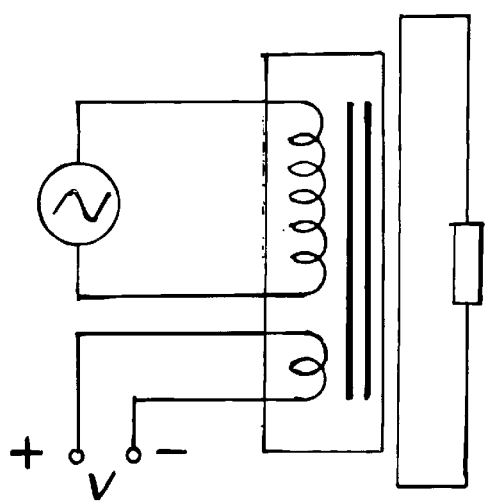
FIG. 2 is a schematic exemplary of a drive probe having two windings in accordance with the hereinafter described invention.

FIG. 2 illustrates the additional voltage surge coil added in the hereinafter described invention.

Figure 3:
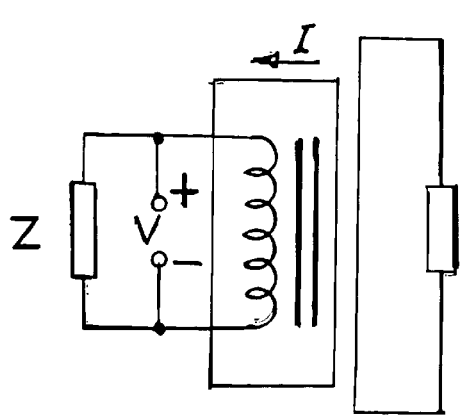
FIG. 3 is a schematic of the coil and measurement technique utilized in accordance with the method of U.S. Pat. No. 5,378,992.
Figure 4:
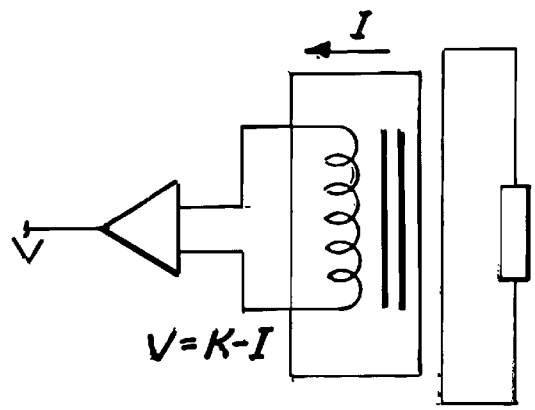
FIG. 4 is illustrative of the present method utilizing a trans-impedance amplifier of amplification K.

FIG. 3 is illustrative of the old method, while FIG. 4 is illustrative of the present method. The present method uses a trans-impedance amplifier with constant of amplification K. The trans-impedance amplifier keeps the voltage across the "sense probe" to very near zero.

Figure 5:
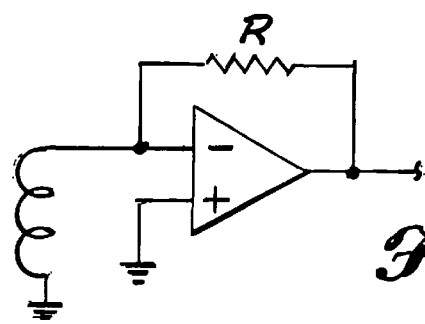
FIG. 5 is a schematic illustrative of an exemplary trans-impedance amplifier utilized in accordance with the present method.

The trans-impedance amplifier is simply a current to voltage converter which can be realized with an op-amp as shown in FIG. 5, where the op-amp output forces the voltage across the coil to be 0. therefore, the voltage at the op-amp output is simply the current in the coil times the resistance R. This is a well-known approach for current to voltage conversion.

With the amplifier it "appears" to the sense probe that it has a short across it, because for all the current it forces out, no voltage is generated. In this way the "sense probe" is kept from saturating (volts times seconds causes saturation, if no volts, no saturation) and it also keeps the reflected impedance of the "sense probe" circuit to the loop shielded wire and structure very low. This "reflected" impedance is the impedance added to the loop by the current sensing coil, as shown in FIG. 6.

In the FIG. 6 method of U.S. Pat. No. 5,367,992 the reflected impedance is Z divided by alpha, the transfer impedance of the sense probe. For an ideal probe, this would be the turns ratio, which is greater than one. In FIG. 7 in accordance with the present method an already low impedance is reflected to zero, so it can be neglected in the measurement of the loop impedance.

Because of these two improvements, no calibration process is needed, and the instrument to measure the loop impedance has less calculation requirements. For example, in the system of U.S. Pat. No. 5,378,992 the calculation is:

Zs+alpha1*((alpha2*Vin/Vout)−alpha1) see FIG. 8.

In accordance with the present method, the calculation is:

Zs+alpha2* Vin/(Vout*alpha1*K), where K is not complex

For well-designed couplers, this reduces to:

Zs+Kt*Vin/Vout, with

Kt=Rf/(alpha*alpha2)

where Rf is the value of the feedback resistor in the trans-impedance amplifier, and alpha2 and alpha 1 are the turns ratios of the voltage sensing loop which is wound around the drive coil and the turns ratio of the current sensing coupler.

This is the actual algorithm utilized in the present Loop Resistance Tester (LRT), which has been tested to be equivalent in accuracy to the previous method.

New Features of the Present System
1) Method for Determining Probe Closure Status The measurement accuracy is dependent upon the probes being fully closed and the probe coupling well to the shield under test. Using the extra winding on the "drive probe", the probe closure status can be checked by the instrument. If the probe is not coupling well to the shield, due to the flux leakage caused by the open coupler, it is also not coupling well to the extra winding.

As shown in FIG. 9, there are two windings and shields. If the coupler opens, the coupling will decrease and $V_S/V_D$ will become less than the winding ratio between these two windings ($N_S/N_D$). A limit is picked such that below that limit the coupler is "open". For example, if $V_S/V_D$ is less than 80% of $N_S/N_D$, the coupler is open.

This feature allows the operator to determine that a probe is not sufficiently clamped around a cable when the operator cannot physically see the probe in the airplane.

To check that both couplers are closed, an extra winding must be added to the "sense probe" also, and the drive voltage switched into it instead of the "drive probe". See FIG. 10.

Figure 10:
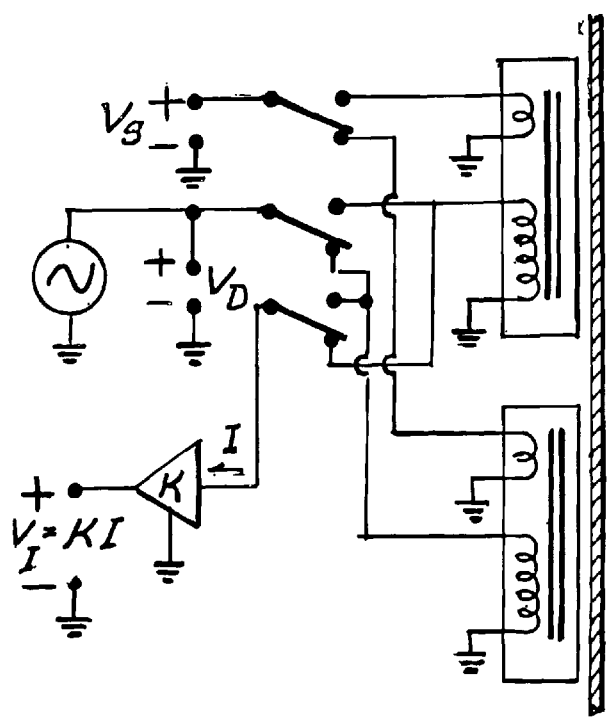
FIG. 10 is a schematic of a probe winding configuration helpful in determining whether both probes are closed.

An extra winding is added to both the "drive probe" and the "sense probe", and the drive and sense circuitry is switched between the drive and sense probe to verify that both probes are closed. Also shown in FIG. 10 is the trans-impedance amplifier being switched such that it is connected to the probe the drive circuitry is not driving.

2) Method for Verifying Electrical Probe Contact to Loop Under Test.

Figure 11:
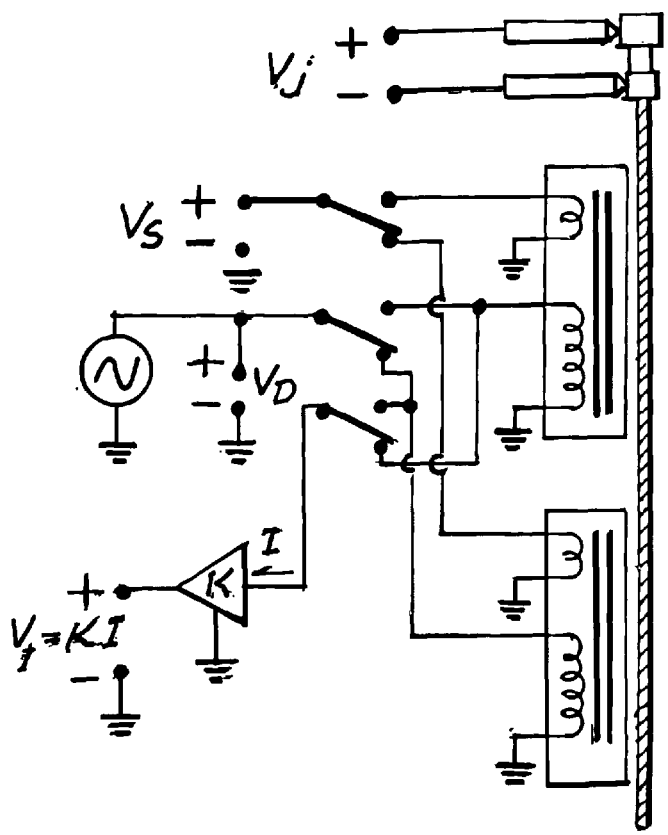
FIG. 11 is a schematic helpful in understanding the method for verifying electrical probe contact to loop under test.
Figure 12:
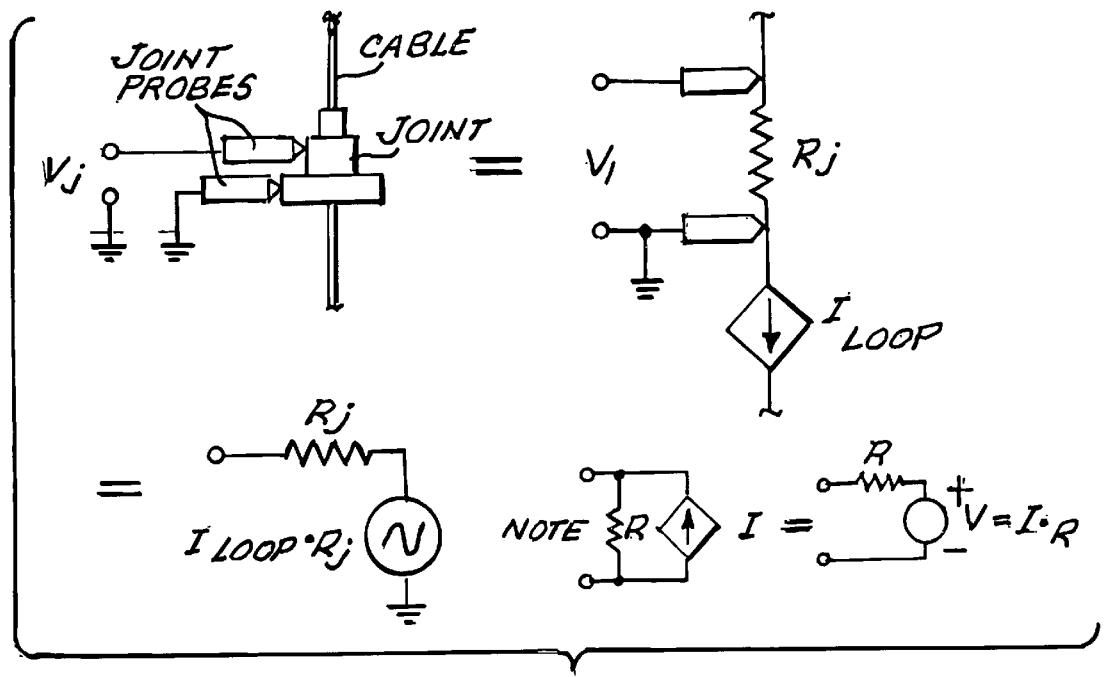
FIG. 12 are schematics showing how the joint voltage (Vj) and the probes and joint can be replaced with an equivalent voltage source.

As hereinbefore described, the algorithm to determine the loop impedance is Zs=Kt*Vin/Vout, and in the FIG. 11, this is $Zs=Kt*V_S/V_I$ Now add the probes shown in FIG. 11 that are hooked directly to the cable under test, preferably at a joint (a connection between cables). The following algorithm, $Zj=Ktj*Vj/V_I$ can be used to find the impedance of a joint in the cable since Vj is the voltage across the joint, and $V_I$ is a representation of the current through the joint. Ktj is a constant similar to Kt. In this way suspect joints in the cable can be found.

The voltage Vj and the probes and joint can be replaced with an equivalent voltage source.

Figure 13:
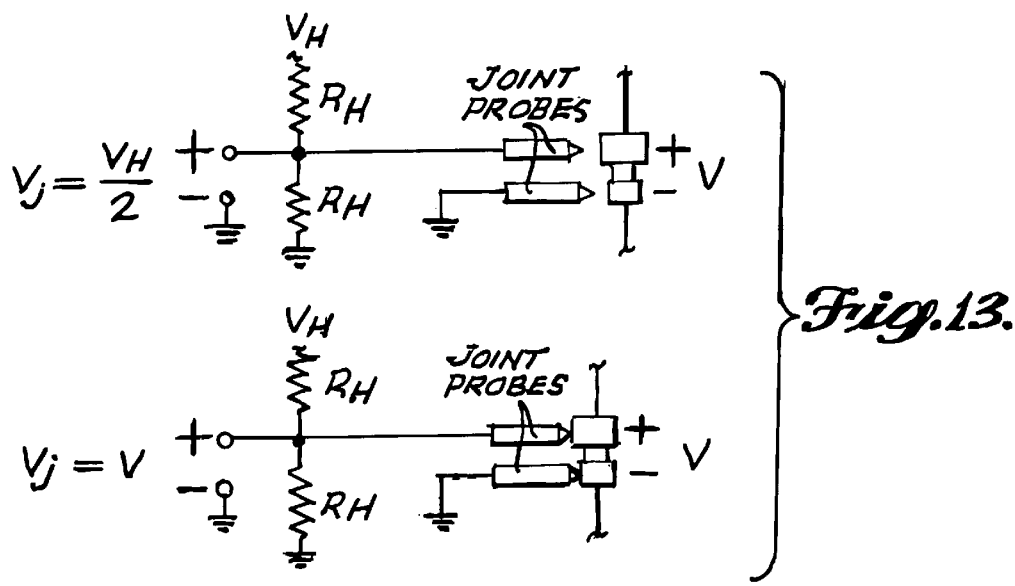
FIG. 13 are further schematics helpful in understanding how adding a much larger voltage source with very high impedance can determine when the probes are connected to the joint.

The impedance Rj of this voltage source is the impedance of the joint, usually around a milliohm. By adding in a much larger voltage source with very high impedance, it can be determined when the probes are connected to the joint. When both probes are connected, the source impedance of the joint is so low it overdrives the high impedance source and the voltage Vj drops to it's normal range. See FIG. 13. $V_H$ is much greater than V. $R_H$ are much larger than the impedance of the joint. When the joint probes are unconnected, $Vj=V_H/2$ as shown in the upper section of FIG. 13. When the probes are connected, the Vj voltage drops to the much lower voltage V. By checking Vj against a threshold between $V_H$ and V, it can be determined if the probes are connected.

Apparatus

Figure 14:
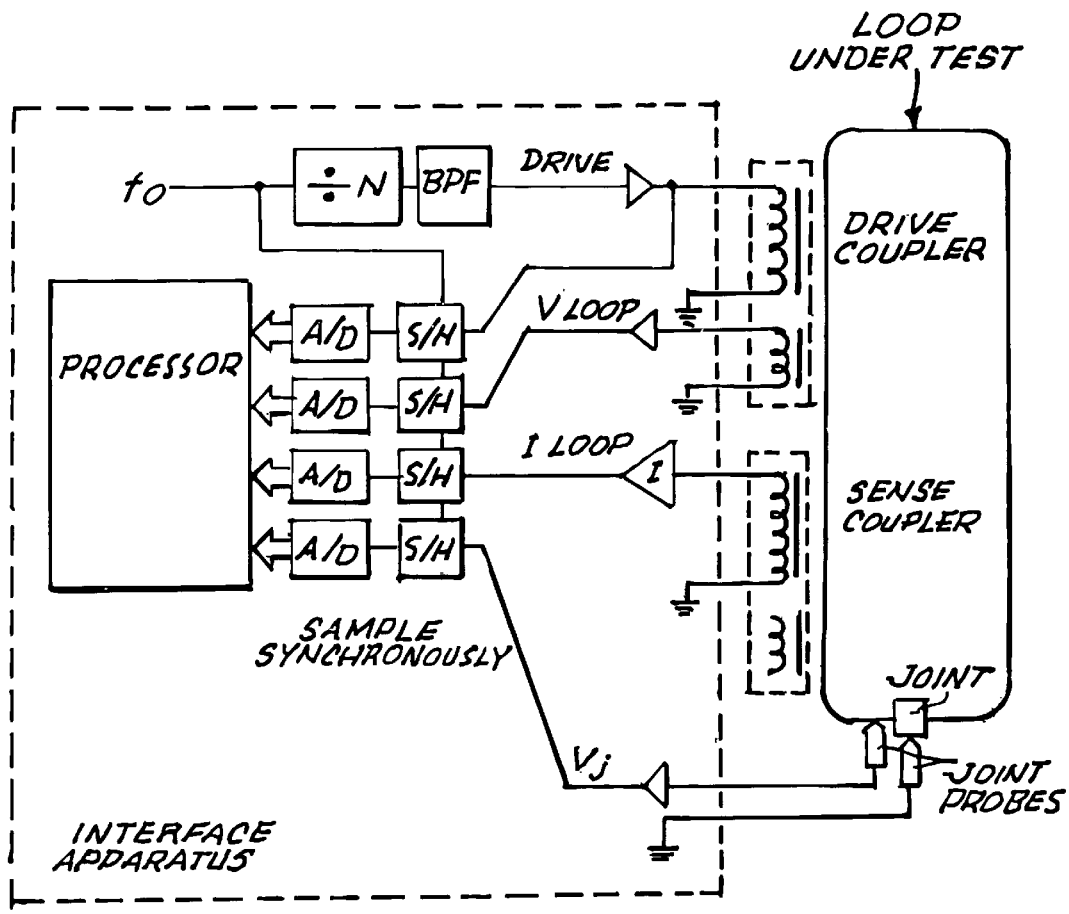
FIG. 14 is illustrative of a shield integrity monitor apparatus embodying the present invention showing sampling of the voltage and current synchronized with the drive signal.

An apparatus embodiment of the present invention consists of sampling of the voltage and current synchronized with the drive signal, as shown in FIG. 14 (FIG. 14 does not show the coupler swapping improvement for simplicity).

A square wave of frequency fo is generated where fo is N times the sinusoidal drive signal frequency, with N being the number of points to sample per waveform cycle. The drive signal is obtained by dividing this signal down by N and then filtering it to produce the sinusoidal drive signal. This signal, the loop voltage signal, the loop current signal, and the joint voltage signal are sampled simultaneously and converted into a series of digital values, which can then be processed to obtain the loop impedance (via Vloop and Iloop), the loop closure status (via the drive voltage and Vloop) and the joint resistance (via Iloop and Vj).

There are several possible approaches to determining the loop resistance from a series of samples of Vloop and Iloop. One approach, based on power, can be expressed as $$R = \frac{\sum_{i=1}^{n} I_{loop}(i) V(i)}{\sum_{i=1}^{n} I_{loop}^2(i)}$$

(In this and the subsequent equations the summation operator can be seen as a simple average, where the 1/N terms are canceled out of the numerator and denominator).

A second approach uses the loop voltage as a reference signal which can be multiplied by the loop current and itself in order to generate an in-phase and quadrature (phasor) representation for the loop current with respect to the loop voltage, with the ratio of these giving the complex loop impedance.

$$\vec{Z} = \frac{\sum_{i=m}^{n} V^2(i) + j\sum_{i=m}^{n} V(i)V(i-m)}{\sum_{i=m}^{n} I_{loop}(i)V(i) + j\sum_{i=m}^{n} I_{loop}(i)V(i-m)}$$

$$m = \frac{f_o T}{4}$$

where $f_o$=sampling frequency

T=drive signal period

The "m" term represents a time delay of ¼ cycle, which is used to generate a quadrature version of the loop voltage, and the summation process again provides the averaging function.

A third approach uses "synthetic" sine and cosine terms to generate the phasor representation of loop voltage and loop current, from which the complex loop impedance can be obtained.

$$\vec{Z} = \frac{\sum_{i=m}^{n} V(i)\sin(i\omega T/N) + j\sum_{i=m}^{n} V(i)\cos(i\omega T/N)}{\sum_{i=1}^{n} I_{loop}(i)\sin(i\omega T/N) + j\sum_{i=1}^{n} I_{loop}(i)\cos(i\omega T/N)}$$

T is the drive signal period, w is the drive signal radian frequency, and N is the ratio of sampling frequency to drive frequency.

Yet another approach uses the sampled drive waveform as the demodulating signal from which the phasor loop voltages and currents are obtained.

$$\vec{Z} = \frac{\sum_{i=m}^{n} V(i)V_{drive}(i) + j\sum_{i=m}^{n} V(i)V_{drive}(i-m)}{\sum_{i=m}^{n} I_{loop}(i)V_{drive}(i) + j\sum_{i=m}^{n} I_{loop}(i)V_{drive}(i-m)}$$

The above methods can also be used as the basis for determining joint resistance, where V represents the joint voltage as opposed to the sensed loop voltage. The LRT uses the "synthetic" sine and cosine approach.

The present LRT can measure DC current by a; b; c; and d; (from claim 11), DC voltage using joint probes, AC current using sense coupler and AC voltage using joint probes or sense winding of the drive probe; and, ohms using joint probes. In this manner of system modification the stray signals can be detected and measured, and the LRT operator can use the LRT as a simple ohm-meter if the operator disconnects a cable and wants to measure ohms across it, or wants to measure across a cable before installing it.

What is claimed is:

1. An electrical cable shield integrity monitoring system for shielded wire in which the shield is in connection with a conducting structure or connected to itself such that a closed electrical current loop is formed, the integrity monitoring system comprising:

(a) a test AC signal generator coupled to said loop using a magnetic (transformer) coupler which can be opened and then closed around the cable being tested;

(b) a test, or "sense", winding placed on said coupler to measure the induced loop voltage;

(c) a receiving circuit employing a magnetic (transformer) coupler to measure the induced loop current, in which the transformer voltage is forced to zero volts and which provides as an output voltage proportional to the loop current;

(d) measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived.

2. Apparatus and method of claim 1, with the complex loop impedance determined by the complex ratio of a numerator term and a denominator term, with the numerator term's real part formed by taking the sum of the square of the loop voltage samples and it's imaginary part formed by taking the sum of the products of the loop voltage and the voltage samples from ¼ cycle previous to the present sample, and the denominator term's real part formed by taking the sum of the products of the loop voltage times the loop current samples and the imaginary part formed by taking the sum of the products of the loop current samples times the loop voltage samples from ¼ cycle previous to the present sample.

3. Apparatus and method of claim 1, with the complex loop impedance determined by the complex ratio of a numerator term and a denominator term, with the numerator term's real part formed by taking the sum of the products of the voltage samples times a sine function of the same frequency as the drive signal, and the imaginary part of the numerator formed by taking the sum of the products of the voltage samples times a cosine function of the same frequency as the drive signal, and the denominator term's real part formed by the sum of the loop current samples times a sine function of the same frequency as the drive signal and the imaginary part formed by the sum of the products of the loop current samples times a cosine function of the same frequency as the drive signal.

4. Apparatus and method of claim 1, with the complex loop impedance determined by the complex ratio of a numerator term and a denominator term, with the numerator term's real part formed by taking the sum of the products of the loop voltage samples times the drive coupler voltage samples and the imaginary part formed by taking the sum of the products of the loop voltage samples times the drive coupler voltage samples from ¼ cycle previous I time, and the denominator term's real part formed by taking the sum of the products of the loop current samples times the drive coupler voltage samples from ¼ cycle previous in time.

5. The shield integrity monitoring system of claim 1 further including an added switching and detection circuit whereby the magnetic couplers can be determined to be closed properly by measuring the ratio of the sense winding's voltage to the drive winding voltage, which determines that the drive coupler is closed if this ratio is within acceptable limits, and then switching the drive coupler and the sense coupler and repeating the same test.

6. The shield integrity monitoring system of claim 1 with an electrical circuit which makes direct contact at two separate points to the loop being tested so that the resistance of that portion of the loop can be measured, utilizing said measurements where the joint voltage is substituted for the loop voltage.

7. The shield integrity monitoring system of claim 6 with an electrical circuit which can determine that both test points are in proper electrical contact with the loop.

8. The shield integrity monitoring system according to claim 7 wherein said both test points are configured to measure resistance between said both test points thereby providing an ohm-meter function.

9. A method for measuring DC current in a loop being tested utilizing the apparatus of claim 7, further comprising the steps of:

(a) disconnecting said electrical circuit;

(b) measuring the resistance between said two separate points of the loop being tested;

(c) measuring the DC voltage across a portion of said loop being tested, utilizing the test point probes; and (d) calculating the DC current by taking the ratio of the DC voltage in step (c) to the resistance from step (b).

10. A method of monitoring the integrity of shielded wire cable comprising sampling the voltage and current synchronized with a drive signal, the method further comprising the steps of:

generating a square wave of frequency fo where fo is N times the sinusoidal drive signal frequency, with N being the number of points to sample per waveform cycle;

said drive signal obtained by dividing the square wave of frequency fo down by N and then filtering to produce the sinusoidal d rive signal, said sinusoidal drive signal, the loop voltage signal, the loop current signal, and the joint voltage signal being sampled simultaneously and converted into a series of digital values, then subsequently processed to obtain the loop impedance coupler closure status, and the joint impedance.

11. The method of claim 10 comprising the further step of:

turning off said drive signal to measure stray currents and stray voltages that are not produced by the loop resistance tester drive signal.

12. The method of producing a measurement of loop resistance in an electrical cable shield integrity monitoring system for shielded wire in which the shield is in connection with a conducting structure or connected to itself such that a closed electrical current loop is formed;

wherein the measurement process comprises the steps of:

multiplying the numeric series of sampled loop current times the sense voltage;

forming the sum of all samples; and, dividing by the sum of the square of the loop current samples, which produces a measurement of the loop resistance.

13. The method of producing a measurement of complex loop impedance in an electrical cable shield integrity monitoring system for shielded wire in which the shield is in connection with a conducting structure or connected to itself such that a closed electrical current loop is formed;

wherein the measurement process comprises the steps of:

determining the complex loop impedance by the complex ratio of a numerator term and a denominator term, with the numerator term's real part formed by taking the sum of the square of the loop voltage samples and it's imaginary part formed by taking the sum of the products of the loop voltage and the voltage samples from ¼ cycle previous to the present sample; and, determining the denominator term's real part formed by taking the sum of the products of the loop voltage times the loop current samples and the imaginary part formed by taking the sum of the products of the loop current samples times the loop voltage samples from ¼ cycle previous to the present sample.

14. The method for determining complex loop impedance in an electrical cable shield integrity monitoring system for shielded wire in which the shield is in connection with a conducting structure or connected to itself such that a closed electrical current loop is formed;

wherein the measurement process comprises the steps of:

determining the complex loop impedance by the complex ratio of a numerator term and a denominator term, with the numerator term's real part formed by taking the sum of the products of the voltage samples times a cosine function of the same frequency as the drive signal, and the imaginary part of the numerator formed by taking the sum of the products of the voltage samples times a cosine function of the same frequency as the drive signal, and the denominator term's real part formed by the sum of the loop current samples times a cosine function of the same frequency as the drive signal and the imaginary part formed by the sum of the products of the loop current samples times a cosine function of the same frequency as the drive signal.

15. A method of determining complex loop impedance in an electrical cable shield integrity monitoring system for shielded wire in which the shield is in connection with a conducting structure or connected to itself such that a closed electrical current loop is formed;

wherein the measurement process comprises the steps of:

determining the complex loop impedance by the complex ratio of a numerator term and a denominator term, with the numerator term's real part formed by taking the sum of the products of the loop voltage samples times the drive coupler voltage samples and the imaginary part formed by taking the sum of the products of the loop voltage samples times the drive coupler voltage samples from ¼ cycle previous in time, and the denominator term's real part formed by taking the sum of the products of the loop current samples times the drive coupler voltage samples and the imaginary part formed b taking the sum of the products of the loop current samples times the drive coupler voltage samples from ¼ cycle previous in time.

16. An electrical cable shield integrity monitoring system for shielded wire in which the shield is in connection with a conducting structure or connected to itself such that a closed electrical current loop is formed, the integrity monitoring system comprising:

(a) a test AC signal generator coupled to said loop using a magnetic (transformer) coupler which can be opened and then closed around the cable being tested;

(b) a test, or "sense", winding placed on said coupler to measure the induced loop voltage;

(c) a receiving circuit employing a magnetic (transformer) coupler to measure the induced loop current, in which the transformer voltage is forced to zero volts and which provides as an output voltage proportional to the loop current;

(d) measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and (e) further including a switching and detecting circuit.

17. A method for determining if the drive coupler is closed in an electrical cable shield integrity monitoring system for shielded wire in which the shield is in connection with a conducting structure or connected to itself such that a closed electrical current loop is formed; the method comprising:

(a) providing a test AC signal generator coupled to said loop using a magnetic (transformer) coupler which can be opened and then closed around the cable being tested;

(b) providing a test, or "sense", winding placed on said coupler to measure the induced loop voltage;

(c) providing a receiving circuit employing a magnetic (transformer) coupler to measure the induced loop current, in which the transformer voltage is forced to zero volts and which provides as an output voltage proportional to the loop current;

(d) providing measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and (e) further providing a switching and detecting circuit; and, measuring the ratio of the sense winding's voltage to the drive winding voltage, thereby determining that the drive coupler is closed if this ratio is within acceptable limits;

and then switching the drive coupler and the sense coupler and repeating the same test.

18. An electrical cable shield integrity monitoring system for shielded wire in which the shield is in connection with a conducting structure or connected to itself such that a closed electrical current loop is formed, the integrity monitoring system comprising:

(a) a test AC signal generator coupled to said loop using a magnetic (transformer) coupler which can be opened and then closed around the cable being tested;

(b) a test, or "sense", winding placed on said coupler to measure the induced loop voltage;

(c) a receiving circuit employing a magnetic (transformer) coupler to measure the induced loop current, in which the transformer voltage is forced to zero volts and which provides as an output voltage proportional to the loop current;

(d) measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and, (e) an electrical circuit which makes direct contact at two separate points to the loop being tested.

19. The invention according to claim 18, further including an electrical circuit for determining that said two separate points are in proper electrical contact with the loop.

20. A measurement process in an electrical cable shield integrity monitoring system for shielded wire in which the shield is in connection with a conducting structure or connected to itself such that a closed electrical current loop is formed, the integrity monitoring system comprising:

(a) providing a test AC signal generator coupled to said loop using a magnetic (transformer) coupler which can be opened and then closed around the cable being tested;

(b) providing a test, or "sense" winding placed on said coupler to measure the induced loop voltage;

(c) providing a receiving circuit employing a magnetic (transformer) coupler to measure the induced loop current, in which the transformer voltage is forced to zero volts and which provides as an output voltage proportional to the loop current;

(d) providing measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and, multiplying the numeric series of sampled loop current times the sense voltage, forming the sum of all samples, and dividing by the sum of the square of the loop current samples, which produces a measurement of the loop resistance; and with the complex loop impedance determined by the complex ratio of a numerator term and a denominator term, with the numerator term's real part formed b taking the sum of the square of the loop voltage samples and idt's imaginary part formed by taking the sum of the products of the loop voltage and the voltage samples from ¼ cycle previous to the present sample, and the denominator term's real part formed by taking the sum of the products of the loop voltage times the loop current samples and the imaginary part formed by taking the sum of the products of the loop current samples times the loop voltage samples from ¼ cycle previous to the present sample.

21. A measurement process in an electrical cable shield integrity monitoring system for shielded wire in which the shield is in connection with a conducting structure or connected to itself such that a closed electrical current loop is formed comprising the steps of:

(a) providing a test AC signal generator coupled to said loop using a magnetic (transformer) coupler which can be opened and then closed around the cable being tested;

(b) providing a test, or "sense" winding placed on said coupler to measure the induced loop voltage;

(c) providing a receiving circuit employing a magnetic (transformer) coupler to measure the induced loop current, in which the transformer voltage is forced to zero volts and which provides as an output voltage proportional to the loop current;

(d) providing measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and, multiplying the numeric series of sampled loop current times the sense voltage, forming the sum of all samples, and dividing by the sum of the square of the loop current samples, which produces a measurement of the loop resistance; and with the complex loop impedance determined by the complex ratio of a numerator term and a denominator term, with the numerator term's real part formed by taking the sum of the products of the voltage samples times a sine function of the same frequency as the drive signal, and the imaginary part of the numerator formed by taking the sum of the products of the voltage samples times a cosine function of the same frequency as the drive signal, and the denominator term's real part formed by the sum of the loop current samples times a sine function of the same frequency as the drive signal and the imaginary part formed by the sum of the products of the loop current samples times a cosine function of the same frequency as the drive signal.

22. A measurement process in an electrical cable shield integrity monitoring system for shielded wire in which the shield is in connection with a conducting structure or connected to itself such that a closed electrical current loop is formed; comprising the steps of:

(a) providing a test AC signal generator coupled to said loop using a magnetic (transformer) coupler which can be opened and then closed around the cable being tested;

(b) providing a test, or "sense", winding placed on said coupler to measure the induced loop voltage;

(c) providing a receiving circuit employing a magnetic (transformer) coupler to measure the induced loop current, in which the transformer voltage is forced to zero volts and which provides as an output voltage proportional to the loop current;

(d) providing measuring apparatus in which the drive coupler winding voltage, the drive coupler sense winding voltage, and the voltage from the sense coupler current to voltage converter output are synchronously sampled to produce a discrete time series of numeric values, with each value scaled by the number of windings on the coupler from which it is derived; and, p1 multiplying the numeric series of sampled loop current times the sense voltage, forming the sum of all samples, and dividing by the sum of the square of the loop current samples, which produces a measurement of the loop resistance; and with the complex loop impedance determined by the complex ratio of a numerator term and a denominator term, with the numerator term's real part formed by taking the sum of the products of the loop voltage samples times the drive coupler voltage samples and the imaginary part formed by taking the sum of the products of the loop voltage samples times the drive coupler voltage samples from ¼ cycle previous in time, and the denominator term's real part formed by taking the sum of the products of the loop current samples times the drive coupler voltage samples from ¼ cycle previous in time.

23. A measurement process in an electrical cable shield integrity monitoring system for shielded wire in which the shield is in connection with a conducting structure or connected to itself such that a closed electrical current loop is formed; comprising the steps:

providing a low frequency test AC signal generator coupled to said loop using a magnetic (transformer) coupler which can be opened and then closed around the cable being tested;

providing a receiving circuit employing a magnetic (transformer) coupler to measure the induced loop current, in which the transformer voltage is forced to zero volts and which provides as an output voltage proportional to the loop current;

providing a measuring apparatus having a test, or "sense", winding placed on said coupler to measure the induced loop voltage and in which the drive coupler winding voltage, the sense winding voltage, and the voltage from the sense coupler current to voltage converter output are synchronously sampled to produce a discrete time series of numeric values, with each value scaled by the number of windings on the coupler from which it is derived; and, multiplying the numeric series of sampled loop current times the sense voltage, forming the sum of all samples, and dividing by the sum of the square of the loop current samples, which produces a measurement of the loop resistance.

* * * * *